(12) United States Patent
Brewton

(10) Patent No.: US 7,398,192 B2
(45) Date of Patent: Jul. 8, 2008

(54) VARIABLE STRUCTURE IN PHYSICAL MODELING

(75) Inventor: Nathan E. Brewton, Wayland, MA (US)

(73) Assignee: The MathWorks, Inc., Natick, MA (US)

( * ) Notice: Subject to any disclaimer, the term of this patent is extended or adjusted under 35 U.S.C. 154(b) by 208 days.

(21) Appl. No.: 11/300,973

(22) Filed: Dec. 15, 2005

(65) Prior Publication Data

US 2007/0143092 A1    Jun. 21, 2007

(51) Int. Cl.
*G06F 17/50*    (2006.01)
*G06F 13/00*    (2006.01)

(52) U.S. Cl. .............................. 703/2; 703/18; 345/619; 382/191

(58) Field of Classification Search ...................... 703/1, 703/2, 18; 382/243, 191; 345/619, 441
See application file for complete search history.

(56) References Cited

U.S. PATENT DOCUMENTS 4,792,978 A * 12/1988 Marquiss ..................... 381/431
6,141,454 A * 10/2000 Seymour et al. ............ 382/243

* cited by examiner

*Primary Examiner*—Thai Phan
(74) *Attorney, Agent, or Firm*—Lahive & Cockfield, LLP; Kevin J. Canning

(57) ABSTRACT

A method and apparatus programmatically define structure within a physical modeling environment. The system and corresponding method of modeling, provides a computationally based modeling environment in which a physical entity can be modeled parametrically and hierarchically, if desired. A physical component of the physical entity is identified. The physical component is defined by a structural physical parameter and a behavior. The definitions combine to form a model element with the structural physical parameter using structural variables, and behaviors, that can be defined functionally.

32 Claims, 6 Drawing Sheets

VARIABLE STRUCTURE IN PHYSICAL MODELING

COPYRIGHT

A portion of the disclosure of this patent document contains material that is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

FIELD OF THE INVENTION

The present invention relates to a system and method suitable for modeling physical entities, and more particularly to a computationally based modeling environment for modeling physical entities having both a structural physical parameter and a physical behavior defining the entities.

BACKGROUND OF THE INVENTION

The present invention relates to electronic or computationally based modeling applications that model physical entities, such as structures, mechanisms, or devices. Some example modeling applications that can model physical entities include Modelica (an international, independent modeling language), 20-Sim (provided by Controllab Products B.V. of the Netherlands), and Saber® VHDL-AMS (provided by Synopsys, Inc. of Mountain View, Calif.) are physical modeling languages and allow for structural elements. Some additional representative physical modeling languages include SimMechanics™, SimPowerSystems™, and SimDriveline™, all offered by The MathWorks, Inc., of Natick, Mass. SimMechanics™ simulates the motion of mechanical devices and generates mechanical performance measurements associated with this motion. SimPowerSystems™ provides tools for modeling and simulating basic electrical circuits and detailed electrical power systems. SimDriveline™ provides tools for modeling and simulating the mechanics of driveline (drivetrain) systems.

All of the above mentioned applications, in addition to others not specifically mentioned, are physical modeling applications. However, none of the known modeling or simulation applications allows modeling of a physical structure that varies structurally and maintains functionally defined physical behaviors. Rather, the modeling and simulation applications require a static or declarative structure in much the same way that the C programming language requires the programmer to declare the fields of a structure.

SUMMARY OF THE INVENTION

There is a need for a system and method suitable for modeling physical entities, wherein the structure of the physical entities is programmatically defined and variable based on, or derived from, parameters. The present invention is directed toward further solutions to address this need.

As utilized in the present description, a physical modeling language generally refers to a textual and graphical language that provides for the description of physical phenomena. The graphical portion of the language involves connecting individual elements, each representing a particular device or effect, together to form a system. One feature of a physical modeling language is that the semantics associated with the connections may be non-directional or acausal.

Behavioral elements that can be modeled in physical modeling languages can be described from first principles. That is, they can be based on mathematical equations, such as for a mass, or for a spring. Whereas, structural elements that can be modeled by physical modeling languages can be elements that are described as composites of other elements. Examples of structural elements include a 2-way hydraulic valve that consists of a pair of variable orifices, a blower, a heat exchanger, or an electrical circuit component.

In accordance with one example embodiment of the present invention, in a computationally based modeling environment, a method of modeling a physical entity includes selecting a physical component of the physical entity being modeled, wherein the physical component is defined by at least a structural physical parameter and at least one physical behavior. The method continues with defining a model element with the structural physical parameter using at least one structural variable, the model element further defined by the at least one physical behavior. The at least one structural variable is functionally defined.

In accordance with aspects of the present invention, the modeling environment can include a textual and/or graphical modeling language defining the computationally based modeling environment. The physical entity can include a structure, mechanism, or device having physical attributes that can be modeled. Describing the physical component by defining a model element can include programmatically defining the model element. Connections to the model element describing the physical component can be non-directional or acausal.

In accordance with further aspects of the present invention, the at least one structural variable varies parametrically during model operation. User input can vary the at least one structural variable prior to, during, or after model operation.

In accordance with further aspects of the present invention, the physical entity can include at least one physical component. In addition, the model can be expanded with hierarchical constructs of the model element.

In accordance with one example embodiment of the present invention, in a computationally based modeling environment, a method of modeling a physical entity can include identifying a physical component of the physical entity being modeled, wherein the physical component is defined by at least a structural physical parameter and at least one physical behavior. The method can further include forming a model element modeling the physical component in the modeling environment by providing at least one function-based structural variable to define the structural physical parameter and at least one behavior to define the behavior of the model element.

In accordance with another embodiment of the present invention, in a computing device, a system providing a computationally based modeling environment modeling a physical entity having a physical component can be provided. The system can include a model for modeling the physical entity. A model element can be provided modeling the physical component of the physical entity by defining at least a structural physical parameter and at least one physical behavior. The structural physical parameter can be defined using at least one structural variable. The at least one structural variable can be functionally defined.

In accordance with aspects of the system of the present invention, the modeling environment can include a textual and/or graphical modeling language defining the computationally based modeling environment. The physical entity can include a structure, mechanism, or device having physical attributes that can be modeled. The physical component can be described by defining a model element programmatically.

Connections to the model element describing the physical component can be non-directional or acausal.

In accordance with further aspects of the system of the present invention, the at least one structural variable can vary parametrically during model operation. User input can vary the at least one structural variable prior to, during, or after model operation.

In accordance with further aspects of the system of the present invention, the physical entity can be comprised of at least one physical component. The model can further include hierarchical constructs of the model element.

In accordance with one embodiment of the present invention, a medium for use in a computationally based modeling environment on a computing device is provided. The medium holds instructions executable using the computing device for performing a method of modeling a physical entity. The method includes selecting a physical component of the physical entity being modeled, wherein the physical component is defined by at least a structural physical parameter and at least one physical behavior. A model element is defined with the structural physical parameter using at least one structural variable, the model element further defined by the at least one physical behavior. The at least one structural variable is functionally defined.

BRIEF DESCRIPTION OF THE DRAWINGS

The present invention will become better understood with reference to the following description and accompanying drawings, wherein.

DETAILED DESCRIPTION

Figure 1:
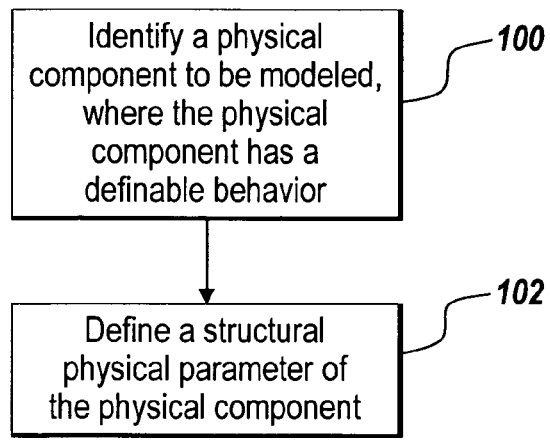
FIG. 1 is a flowchart showing a method of physical modeling, according to one aspect of the present invention.

An illustrative embodiment of the present invention relates to a programmatic approach to defining structure within a physical modeling environment. The software application, and corresponding method of modeling, provides a computationally based modeling environment in which a physical entity can be modeled. A physical component of the physical entity is identified. The physical component is defined by a structural physical parameter and at least one physical behavior. The definitions combine to form a model element with the structural physical parameter using at least one structural variable and the at least one physical behavior.

The structural variable and the physical behavior are functionally defined. Therefore, the structure of the physical entity as represented by the model element can be defined at compile time based on some parameters and flow-control statements. The structure of the physical entity can also vary before, during, or after model operation.

The flexibility provided by a variable structure allows the user to manage complex structural manipulation parametrically. Additionally the user may wish pick certain portions of the structure such that the element is optimized for numerical stability, computational speed, or real-time simulation. In this case the user's choice of optimal structure may depend on the parameterization of the element.

FIGS. 1 through 7, wherein like parts are designated by like reference numerals throughout, illustrate an example embodiment of a system and method for programmatically defining physical structures in a computationally based model or simulation environment, according to the present invention. Although the present invention will be described with reference to the example embodiments illustrated in the figures, it should be understood that many alternative forms can embody the present invention. One of ordinary skill in the art will additionally appreciate different ways to alter the parameters of the embodiments disclosed in a manner still in keeping with the spirit and scope of the present invention.

FIG. 1 is a flowchart showing a method of physical modeling in accordance with one embodiment of the present invention. The method can have a number of different variations. In accordance with one example implementation, a physical component is identified (step 100). The physical component can be one or more characteristic or property of a physical entity. As mentioned previously, a physical entity can include such physical items as structures, mechanisms, or devices. The physical component can be one characteristic, feature, property, or other definable portion of the physical component. The physical entity can be formed of one or more physical components. The method continues with defining a structural physical parameter (step 102) of the physical component, wherein the physical component is further defined by at least one physical behavior. The order of the structural physical parameter definition step 102 and the provision of the physical behavioral definition can be reversed, or can be simultaneous, such that the order illustrated is merely representative of one example embodiment.

As previously mentioned, behavioral elements can be described from first principles, and described by mathematical equations, such as for a mass, a spring, a resistance, a flow, or the like. Structural elements can be elements that are described as composites of other elements, such as a 2-way hydraulic valve, a blower, a heat exchanger, or an electrical circuit. The structural physical parameter defines one portion of the physical component, while the physical component maintains physical behavioral features. The combination of the structural physical parameter with the behavioral features forms a model element that models the physical component of the physical entity. Because the physical entity can be described by one or more physical components, having one or more structural and behavioral physical features, there can likewise be one or more model elements in the model of the physical entity.

Figure 2:
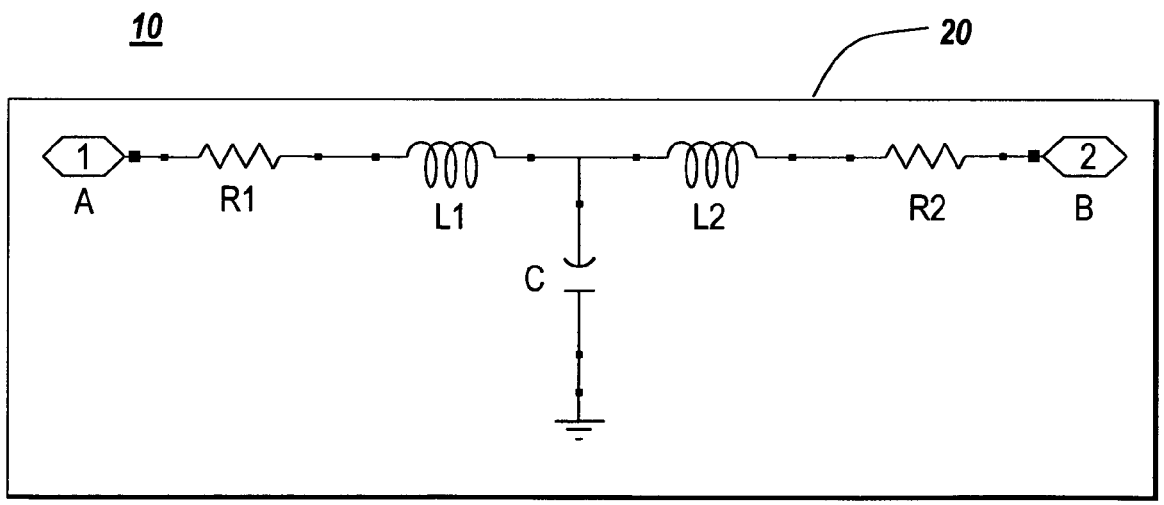
FIG. 2 is a diagrammatic illustration of an example physical entity in the form of a single power line segment, according to one aspect of the present invention.

FIG. 2 is a diagrammatic illustration of an example physical entity 10 in the form of a single power line segment 20, according to one aspect of the present invention. A distributed power line is a physical element that models a power line with resistive, capacitive and inductive behavior. A typical model of such a power line consists of a number of individual segments connected in series. Like the full power line, each power line segment 20 contains resistive, capacitive, and inductive elements.

Specifically, the single power line segment includes two resistors, R1 and R2, two inductors, L1 and L2, and one grounded capacitor, C. Each of the resistive, capacitive, and inductive elements is described with a textual input language. For example a textual input language such as MATLAB® (provided by The MathWorks of Natick, Mass.) or equivalent, can be utilized. For purposes of illustration, textual program language examples using MATLAB® will be provided. However, the present invention is by no means limited to use with MATLAB®, as would be understood by one of ordinary skill in the art. Other program languages, such as C++ or Java, Perl from the PERL foundation/CPAN, Python from the Python Software Foundation, Visual Basic from Microsoft Corporation, Scilab from INRIA (French National Institute for Research in Computer Science), Octave from GNU Octave, Mathematica® from Wolfram Research, Inc., Maple® from Maplesoft, a division of Waterloo Maple Inc., Maxima (a descendant of Macsyma developed at the Massachusetts Institute of Technology), or others not specifically mentioned, can be utilized in accordance with the present invention.

In the example provided herein, each of the resistive, capacitive, and inductive elements inherits from an element called "branch". Below is a listing of "branch.m", which is the m-file (MATLAB® file type) that describes the branch element:

```
function branch(root, schema)
% Simple electrical branch.
% Copyright 2005 The MathWorks, Inc.
    schema.descriptor = 'Branch';
    schema.visible = false;
    p = schema.terminal('p');
    p.description = 'Positive Terminal';
    p.domain      = root.electrical.electrical;
    p.label       = '+';
    p.location    = {'Left', 0.5};
    n = schema.terminal('n');
    n.description = 'Negative Terminal';
    n.domain      = root.electrical.electrical;
    n.label       = '-';
    n.location    = {'Right', 0.5};
    schema.setup(@setup);
end
function setup(root, branch)
    branch.branch_across( 'v', branch.p.v, branch.n.v);
    branch.branch_through('i', branch.p.i, branch.n.i);
end
```

The "branch" listing has two sections or functions, the "schema" section (beginning with "schema.descriptor='Branch';") and the "setup" section (beginning with "function setup(root, branch)"). The schema section describes the interface to the branch element, including its terminals, its parameters, and the like. This base element introduces two electrical terminals in the setup section, p, and n, for positive and negative respectively.

The setup section prepares for operation of the model. During the setup function, two variables are introduced, v, and i. These variables respectively represent voltage across the two terminals and current from one terminal to the other. These terminals and variables are common to "resistor", "capacitor", and "inductor" which derive from "branch".

The next listing is of "resistor.m" which describes a linear resistor, such as resistor R1 or resistor R2:

```
function resistor(root, schema)
% Models a linear resistor.
% Copyright 2005 The MathWorks, Inc.
    schema.extends(root.electrical.branch);
    schema.descriptor = 'Resistor';
    % Parameter definition
    r = schema.parameter('R');
    r.description = 'Resistance';
    r.type    = ne_type('real', [1 1], 'Ohm');
    r.default = {1, 'Ohm'};
    schema.setup(@setup);
end
function setup(root, resistor)
    resistor.equation(@equation);
end
function e = equation(sys, resistor)
    e = sys.equation;
    e(1) = resistor.i * resistor.R - resistor.v;
end
```

The function "resistor" inherits from, or extends, the "branch" element. This means that it automatically has as part of its interface two terminals, p and n, and introduces two variables v and i. In addition to the two terminals, there is a parameter, R, which represents the resistance of the resistor. In accordance with the present invention, the "equation" section is provided. The equation section introduces the mathematical model of the resistor (such as resistors R1, R2). Traditionally, a linear resistor is described with Ohm's law ($v=iR$, where v represents voltage, i represents capacitance, and R represents resistance). In textual terms, with the equation set to zero, this becomes:

```
function e = equation(sys, resistor)
    e = sys.equation;
    e(1) = resistor.i * resistor.R - resistor.v;
end
```

The value of "function e" returned by "equation" is forced to zero by the solver. Capacitors and inductors are described in similar ways.

The present invention as described herein and demonstrated with the above example embodiment relates to a system and method of modeling a physical entity in a computationally based modeling environment that goes beyond the conventional static definitions required by other modeling and simulation applications. Referring back to FIG. 1, and the example method of implementing the present invention, the system and method identifies a physical component of a physical entity 10 being modeled (step 100). The physical component can be one or more characteristic or property of a physical entity 10. In the example provided, the physical entity took the form of physical entity 10 in the form of a single power line segment 20. The components of the physical entity single power line segment 20 included the two resistors, R1 and R2, two inductors, L1 and L2, and one grounded capacitor, C. Each component of the physical entity single power line segement 20 has its own properties, both structural and behavioral. Resistors, inductors, and capacitors are all formed differently, and all have different functionality during operation.

The method continues with defining a structural physical parameter (step 102) of the physical component, wherein the physical component maintains its behavioral features. In the example above, the schema section describes the interface to the branch element, including its terminals, its parameters, and the like. Specifically in the case of the resistor, the interface includes two electrical terminals p and n, for positive and negative, respectively. This represents a structural physical parameter of the resistors R1, R2.

Further in the example above, the function "resistor" inherits from, or extends, the "branch" element. As described, "resistor" inherits the physical structure of two terminals, p and n. However, "resistor" introduces variables v, i, and R. Parameter R represents a behavioral characteristic of the resistor R1, R2, namely, the resistance. The equation section introduces the mathematical model of the resistor's resistance using Ohm's law.

With similar programmatic structural and behavioral definitions for the inductors L1, L2 and capacitor C, the present invention provides both structural and behavioral physical definitions of the single power line segment 20. The structural definitions are parametrically based, and the parameters can be provided with constants or with functions to define the parameters. Altogether, the result is a model element representing the physical entity 10 of the single power line segment 20.

The language utilized to describe the model element representing the physical entity 10 of the single power line segment 20, and model elements generally, can be textually and/or graphically based. The language utilized can define the model element programmatically to describe, model, or simulate the physical component of the physical entity 10. It should additionally be noted that because the model element is described programmatically using variables and parameters, the structural variables have the ability to vary parametrically during model operation. User input, programmatic input, or input from other sources both user and computationally based can be provided to vary the structural variables. These modifications can occur prior to, during, or after model operation.

Figure 3:
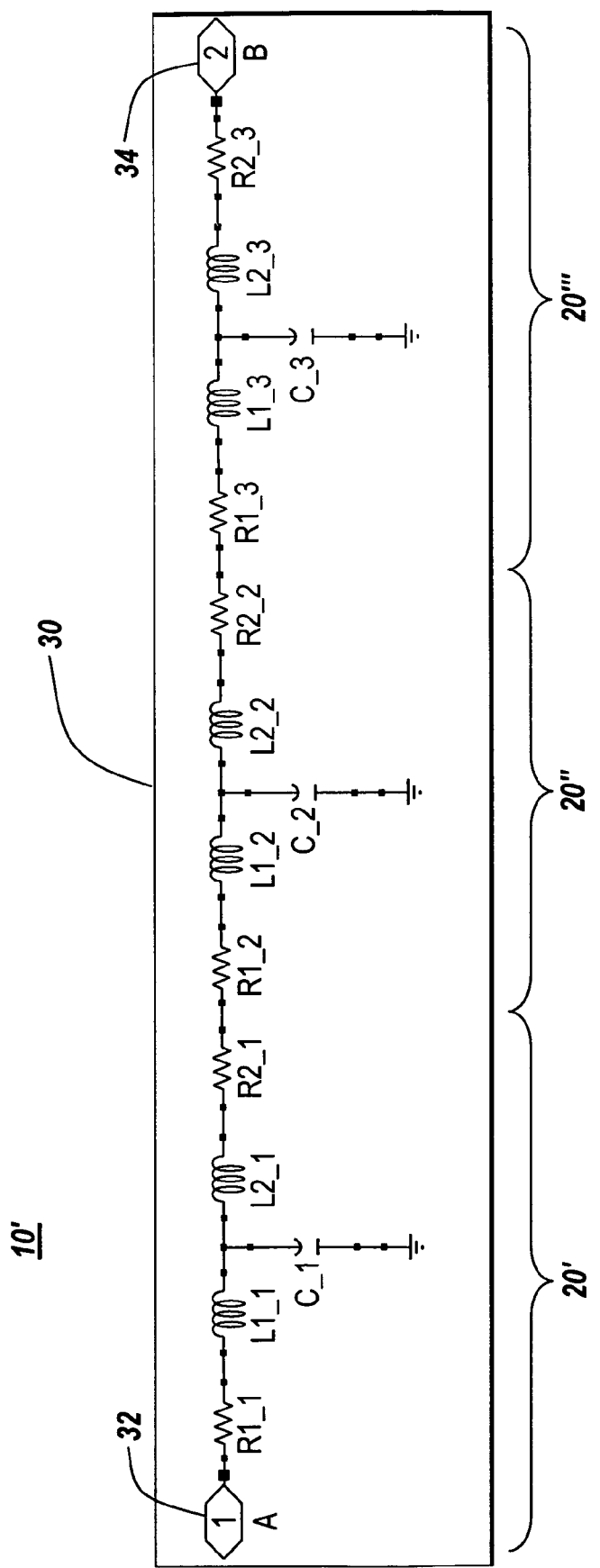
FIG. 3 is a diagrammatic illustration of an example physical entity of a multi-segmented power line, according to one aspect of the present invention.

With the added flexibility provided by the programmatic physical definitions of the present invention, hierarchical model structures can be formed that are modular in form. FIG. 3 is a diagrammatic illustration of an example physical entity 10' of a multi-segmented power line 30, in accordance with one example embodiment of the present invention. The multi-segmented power line 30 is formed of three single power line segments 20', 20", and 20'", as were depicted in FIG. 2. The single power line segments 20', 20", and 20'" connected in series to form the multi-segmented power line 30 represent a distributed power line.

Each of the three single power line segments 20', 20", and 20'" consists of two resistors R1 and R2, two inductors L1 and L2, and a capacitor C. Additionally, a source node 32 and a destination node 34 for the distributed power line are provided. To maintain organization in the physical entity 10', each segment 20', 20", 20'" may be encapsulated into a hierarchical element. These hierarchical elements may be described with the same MATLAB-based textual input language. Connections to the model elements describing the physical components can be non-directional and/or acausal.

The listing below is for "segment.m", which describes, textually, a single segment, such as the single power line segment 20 of FIG. 2, or each of the three single power line segments 20', 20", 20'" of FIG. 3.

```
function segment(root, schema)
   %Implement a simple RLC segment
      schema.descriptor = 'Segment';
      p = schema.terminal('p');
      p.description = 'Positive Terminal';
      p.domain    = root.electrical.electrical;
```

-continued

```
      p.label     = '+';
      p.location  = {'Left', 0.5};
      n = schema.terminal('n');
      n.description = 'Negative Terminal';
      n.domain    = root.electrical.electrical;
      n.label     = '-';
      n.location  = {'Right', 0.5};
      r = schema.parameter('r');
      r.description = 'Resistance';
      r.type      = ne_type('real', [1 1], 'Ohm');
      r.default   = {1, 'Ohm'};
      l = schema.parameter('l');
      l.description = 'Inductance';
      l.type      = ne_type('real', [1 1], 'H');
      l.default   = {1, 'H'};
      c = schema.parameter('c');
      c.description = 'Capacitance';
      c.type      = ne_type('real', [1 1], 'F');
      c.default   = {1e-6, 'F'};
      schema.setup(@setup);
end
function setup(root, segment)
   %
   % first and second resistors
   %
   r1 = segment.element('r1', root.electrical.elements.resistor);
   r1.r = segment.r / 2;
   r2 = segment.element('r1', root.electrical.elements.resistor);
   r2.r = segment.r / 2;
   %
   % first and second inductors
   %
   l1 = segment.element('l1', root.electrical.elements.inductor);
   l1.1 = segment.1 / 2;
   l2 = segment.element('l1', root.electrical.elements.inductor);
   l2.1 = segment.1 / 2;
   %
   % the capacitor
   %
   c1 = segment.element('c1', root.electrical.elements.capacitor);
   c1.c = segment.c;
   %
   % introduce three intermediate electrical nodes
   %
   n1 = segment.node('n1', root.electrical.electrical);
   n2 = segment.node('n2', root.electrical.electrical);
   n3 = segment.node('n3', root.electrical.electrical);
   %
   % connect first resistor to positive terminal of segment
   %
   segment.connect(r1.p, segment.p);
   %
   % connect the first resistor to the first inductor at n1
   %
   segment.connect(r1.n, n1);
   segment.connect(l1.p, n1);
   %
   % connect the first inductor to the second inductor at n2
   %
   segment.connect(l1.n, n2);
   segment.connect(l2.p, n2);
   %
   % connect the second inductor to the second resistor at n3
   %
   segment.connect(l2.n, n3);
   segment.connect(r2.p, n3);
   %
   % connect the negative terminal of the second resistor to
   % the negative terminal of the segment
   %
   segment.connect(r2.n, segment.n);
   %
   % connect the capacitor between n2 and ground, note that passing
   % no second argument to connect connects the terminal to ground.
   %
   segment.connect(c1.p, n2);
   segment.connect(c1.n);
end
```

The description of the single power line segments 20, 20', 20", 20'" requires a schema and setup section. In the setup section for this element an underlying structure has been introduced. Using the ".element" command, the resistors R1, R2, inductors L1, L2, and capacitor C elements are introduced within the segment. Using the ".node" command, three internal nodes are introduced within the segment. Using the ".connect" command, the elements are connected to the nodes and to the external terminals of the segment.

Figure 4:
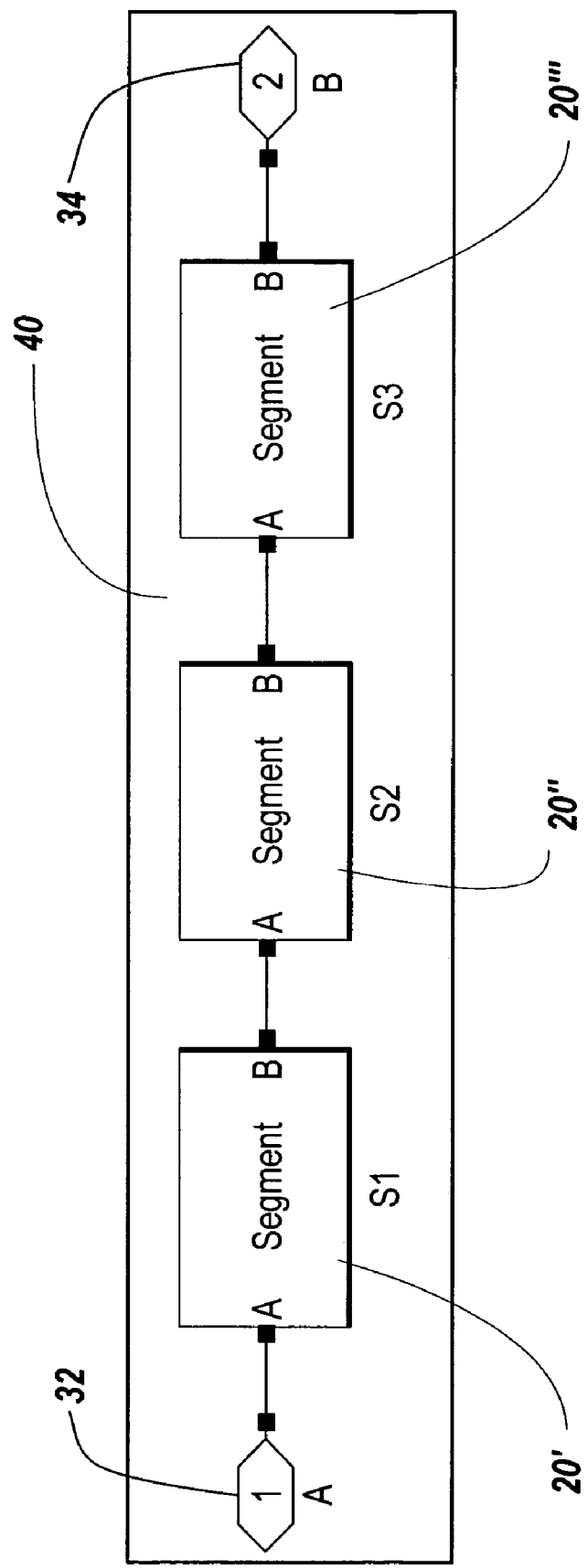
FIG. 4 is a diagrammatic illustration of an example physical model of a physical entity in the form of the multi-segmented power line, according to one aspect of the present invention.

FIG. 4 is a diagrammatic illustration of an example physical power line model 40 of a physical entity in the form of the multi-segmented power line 30, according to one aspect of the present invention. The segment elements as described in "segment.m" have been connected in series to form a three segment power line, or multi-segmented power line 30, like that of FIG. 3. However, the diagrammatic depiction of the multi-segmented power line 30 is now expressed as a model element, i.e., the physical power line model 40. This physical power line model 40 builds upon the original model element described in FIG. 2 as the single power line segment 20, and demonstrates the ability of the system and method of the present invention to scale up or down to modify the structure and behavioral aspects of the physical entity model.

In FIG. 4, each of the three segments representing the single power line segments 20', 20", 20'" has been encapsulated into a first hierarchical element 42, a second hierarchical element 44, and a third hierarchical element 46. Each of the hierarchical elements 42, 44, and 46 are described with the code from "segment.m". One of ordinary skill in the art will appreciate that the three hierarchical elements 42, 44, and 46 may be encapsulated into a single hierarchical element 48 to be used within a larger model.

The following listing of "dist_line.m" describes a distributed line made up of multiple segments. It should be noted that the number of segments is not fixed. Rather, the number of segments, or hierarchical elements 42, 44, 46, is a parameter, "num_segments". The parameter "num_segments" can be provided by a user or another programmatic source.

```
function dist_line(root, schema)
%Implement a simple RLC distributed line with num_segments
% Copyright 2005 The MathWorks, Inc.
    schema.descriptor = 'PI Line';
    p = schema.terminal('p');
    p.description = 'Positive Terminal';
    p.domain     = root.electrical.electrical;
    p.label      = '+';
    p.location   = {'Left', 0.5};
    n = schema.terminal('n');
    n.description = 'Negative Terminal';
    n.domain     = root.electrical.electrical;
    n.label      = '−';
    n.location   = {'Right', 0.5};
    r = schema.parameter('r');
    r.description = 'Resistance';
    r.type       = ne_type('real', [1 1], 'Ohm');
    r.default    = {1, 'Ohm'};
    l = schema.parameter('l');
    l.description = 'Inductance';
    l.type       = ne_type('real', [1 1], 'H');
    l.default    = {1, 'H'};
    c = schema.parameter('c');
    c.description = 'Capacitance';
    c.type       = ne_type('real', [1 1], 'F');
    c.default    = {1e−6, 'F'};
    n = schema.parameter('num_segments');
    n.description = 'Number of Sections';
    n.type       = ne_type('real', [1 1], '1');
    n.default    = 4;
    schema.setup(@setup);
```

-continued

```
end
function setup(root, dist_line)
    %
    % the last node added to the underlying structure
    %
    lastNode = dist_line.p;
    %
    % add the segments
    %
    n = dist_line.num_segments;
    for i = 1:n
        suffix      = int2str(i);
        nodeName    = ['n' suffix];
        segmentName = ['s' suffix];
        %
        % get the new node, if we are on the last node, i.e., i == n, then
        % the new node is the negative terminal on the dist_line otherwise
        % it is a new intermediate electrical node with name nodeName
        %
        if i == n
            newNode = dist_line.n;
        else
            newNode = dist_line.node (nodeName, root.electrical.electrical);
        end
        %
        % add a new segment with name segmentName
        %
        newSegment = dist_line.element(segmentName,
    root.external.test.structural.dist_segment);
        %
        % place the parameters on the new segment
        %
        newSegment.r = dist_line.r / dist_line.num_segments;
        newSegment.l = dist_line.l / dist_line.num_segments;
        newSegment.c = dist_line.c / dist_line.num_segments;
        %
        % connect the new segment and the new node
        %
        dist_line.connect(newSegment.p, lastNode);
        dist_line.connect(newSegment.n, newNode);
        %
        % last node is now new node
        %
        lastNode = newNode;
    end
end
```

Figure 5:
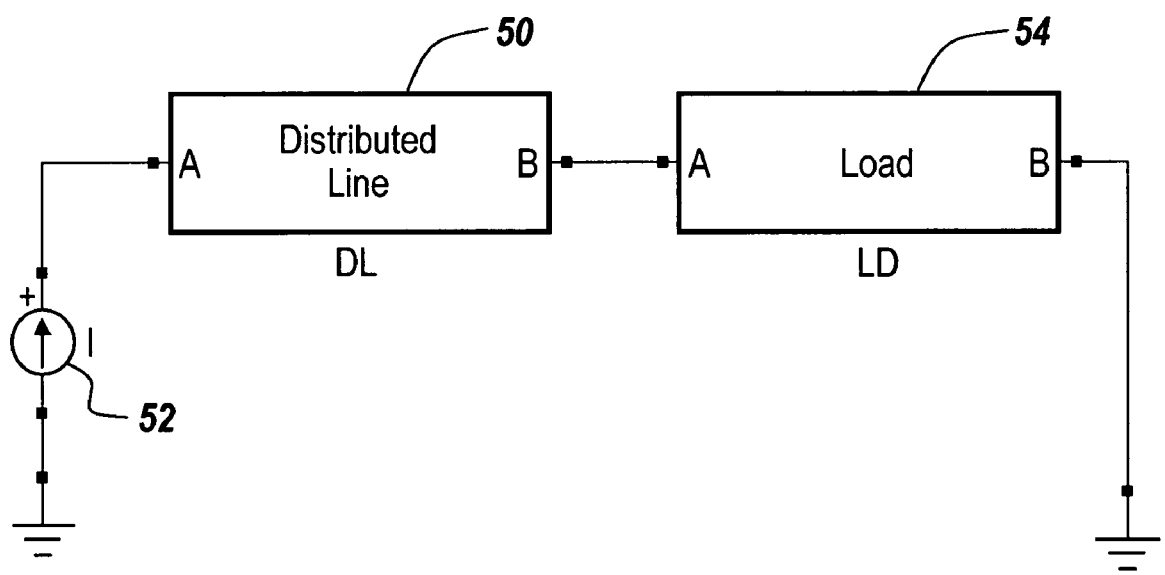
FIG. 5 is a diagrammatic illustration of an example physical entity in the form of an encapsulated distributed power line in series with a current source, according to one aspect of the present invention.

The "schema" portion of this element description is similar to that found in "segment.m". The "setup" function, however, is different. In this embodiment, multiple segments are added in a for-loop. Each pass through the for-loop adds a new segment thus constructing a chain of segments that form a distributed line. FIG. 5 is a diagrammatic illustration of an example physical entity in the form of an encapsulated distributed power line 50 in series with a current source, according to one aspect of the present invention. Specifically, FIG. 5 illustrates the encapsulated distributed line 50 in series with a current source 52 and a generic load 54, forming a model 56 of the physical entity distributed power line. The encapsulated distributed line 50 is formed of hierarchical elements 42, 44, 46 from FIG. 4.

The encapsulated distributed line 50 illustrates the ability to use control-flow, such as if-then-else statements and for-loops, when describing the underlying structure of a physical entity in a model. In other modeling languages like VHDL-AMS and Modelica, the underlying structure of an element is predefined and static in the same way that the fields of a data structure in C are predefined and unchangeable at runtime. However, in accordance with the present invention, the programming language is dynamically typed and allows determination of the underlying physical structure based on parameterization at run time.

It should again be stressed that the description provided herein of the present invention makes use of the illustrative embodiment of a multi-segmented or distributed power line. However, the specific code examples provided, the classes, objects, definitions, and commands utilized in the examples, and all that relate thereto are merely demonstrative of one implementation or use for the present invention. The present invention is by no means limited to modeling power lines, or even electrical systems. Any physical entity model requiring some of the aspects of the present invention, including for example the parameterization and hierarchical constructs in defining physical structure, can by modeled using the system and method of the present invention.

Figure 6:
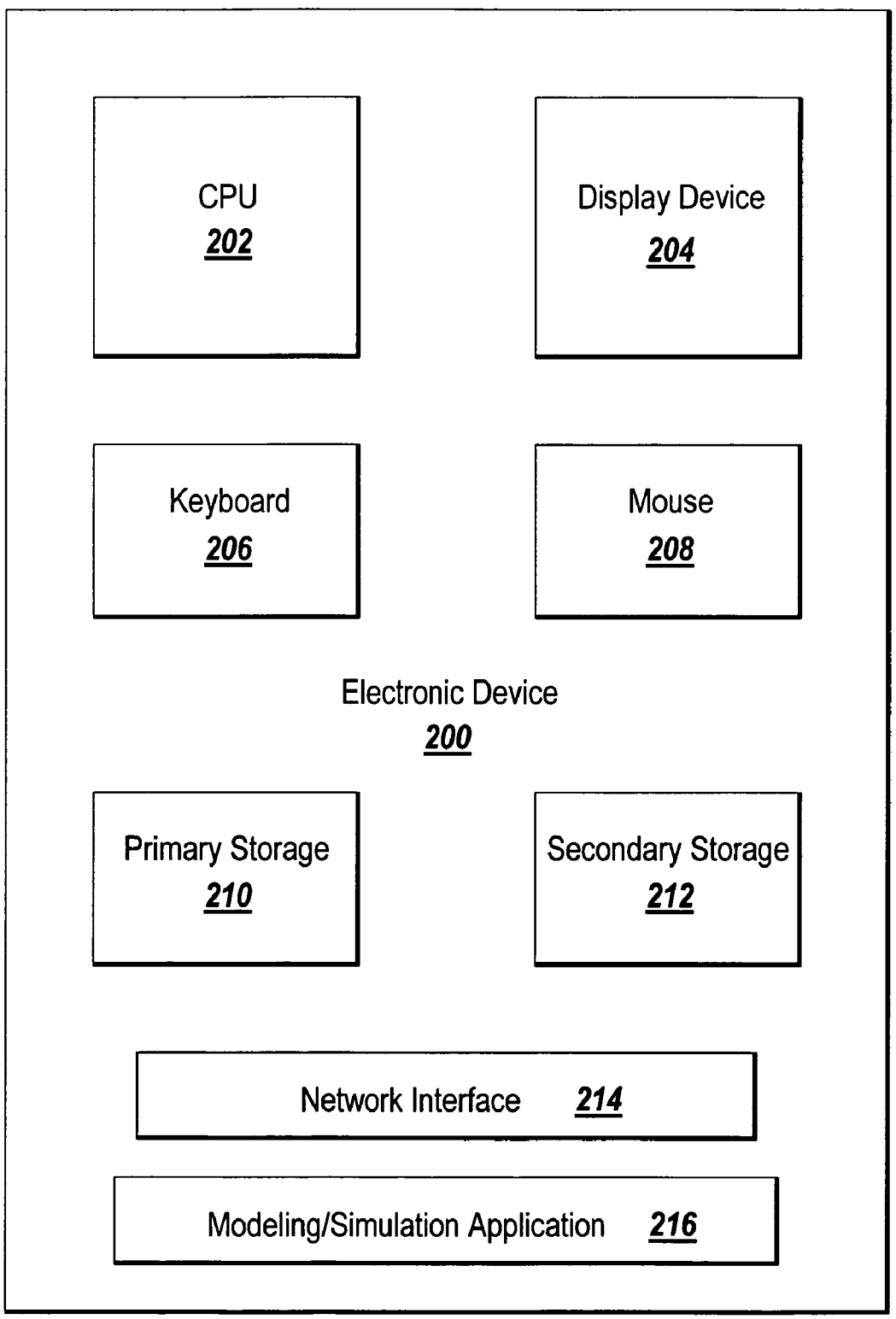
FIG. 6 is a diagrammatic illustration of a computing device for implementing aspects of the present invention.

FIG. 6 illustrates one example embodiment of a computing device 200 suitable for practicing the illustrative embodiments of the present invention. The computing device 200 is representative of a number of different technologies, such as personal computers (PCs), laptop computers, workstations, personal digital assistants (PDAs), Internet appliances, cellular telephones, and the like. In the illustrated embodiment, the computing device 200 includes a central processing unit (CPU) 202 and a display device 204. The display device 204 enables the computing device 200 to communicate directly with a user through a visual display. The computing device 200 further includes a keyboard 206 and a mouse 208. Other potential input devices not depicted include a stylus, trackball, joystick, touch pad, touch screen, microphone, camera, and the like. The computing device 200 includes primary storage 210 and secondary storage 212 for storing data and instructions. The storage devices 210 and 212 can include such technologies as a floppy drive, hard drive, tape drive, optical drive, read only memory (ROM), random access memory (RAM), and the like. Applications such as browsers, JAVA virtual machines, and other utilities and applications can be resident on one or both of the storage devices 210 and 212. The computing device 200 can also include a network interface 214 for communicating with one or more electronic devices external to the computing device 200 depicted. A modem is one form of network interface 214 for establishing a connection with an external electronic device or network. The CPU 202 has either internally, or externally, attached thereto one or more of the aforementioned components. In addition to applications previously mentioned, modeling applications 216, can be installed and operated on the computing device 200.

It should be noted that the computing device 200 is merely representative of a structure for implementing the present invention. However, one of ordinary skill in the art will appreciate that the present invention is not limited to implementation on only the described device 200. Other implementations can be utilized, including an implementation based partially or entirely in embedded code, where no user inputs or display devices are necessary. Rather, a processor can communicate directly with another processor or other device.

Figure 7:
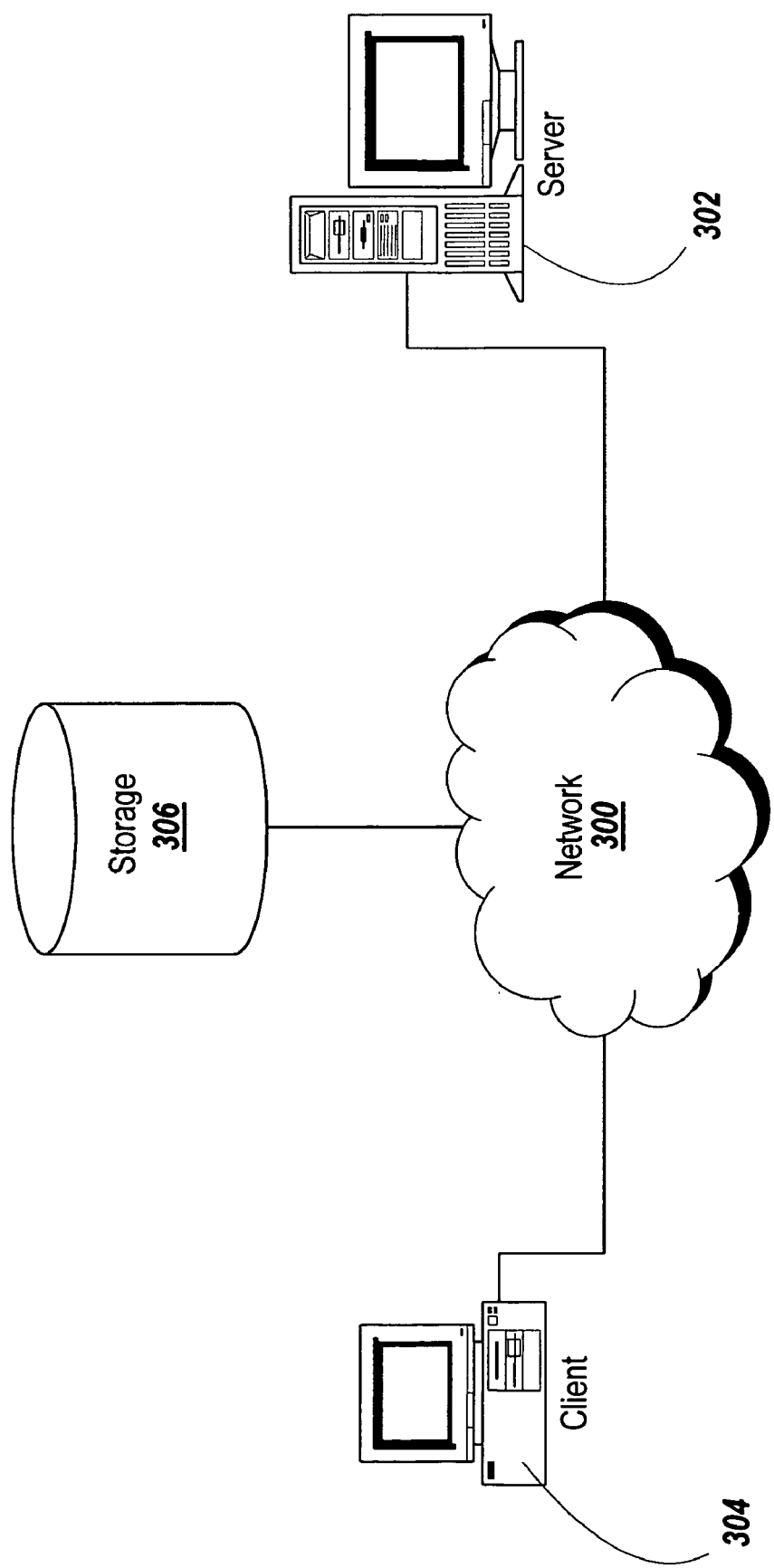
FIG. 7 is a diagrammatic illustration of a network that can support operation of the physical modeling application of the present invention.

Furthermore, examples to this point have focused primarily on the system where the computationally based modeling environment exists on a local electronic device, such as the computing device 200. The computationally based modeling environment may also be implemented on a network 300, as illustrated in FIG. 7. The network 300 can be formed of a number of different components, including a server 302 and a client device 304. Other devices, such as a storage device 306, may also be connected to the network 300.

In accordance with one embodiment of the network 300, the server 302 takes the form of a distribution server for providing to the client device 304 a model component. The model component may be part of a series of model components available to the client device 304 on the server 302. The client device 304 may then use the model component in a client based model for a dynamic system.

In another embodiment, the server 302 may execute the computationally based modeling environment instead of the client device 304. A user may then interact with a user interface to the computationally based modeling environment on the server 302 through the client device 304. The server 302 can be capable of executing a computationally based modeling environment, wherein the computationally based modeling environment provides a model of a dynamic system. The client device 304 is in communication with the server 302 over a network 300. A component of the dynamic model is selected at the server 302 from the client device 304. A functional transformation may then be performed and the results outputted from the selected model component on the server 302 to the client device 304.

It will be understood by one skilled in the art that these network embodiments are merely exemplary, and that the functionality may be divided up in any number of ways, among any number of resources, through a network.

Furthermore, one of ordinary skill in the art will appreciate that there are multiple different variations, embodiments, and aspects of the invention and its implementation. For example, the system implementing the method of the present invention may have more than one processor and that each processor may have more than one core. The system and method of the present invention may run in a virtualized environment, such as in a VM. In addition, multiple VMs may be resident on a single processor. In addition, all or a portion of the system and method of the present invention may run on a FPGA or an ASIC. More generally, hardware acceleration may be used. Other implementation variations of the present invention are understood by those of ordinary skill in the art and are therefore anticipated by the system and method of the invention described herein.

Numerous modifications and alternative embodiments of the present invention will be apparent to those skilled in the art in view of the foregoing description. Accordingly, this description is to be construed as illustrative only and is for the purpose of teaching those skilled in the art the best mode for carrying out the present invention. Details may vary substantially without departing from the spirit of the present invention, and exclusive use of all modifications that come within the scope of the appended claims is reserved. It is intended that the present invention be limited only to the extent required by the appended claims and the applicable rules of law.

What is claimed is:

1. In a computationally based modeling environment, a method of modeling a physical entity, the method comprising:

selecting a physical component of the physical entity being modeled, the physical component programmatically defined by at least a structural physical parameter and at least one physical behavior;

programmatically defining a model element with the structural physical parameter using at least one structural variable defined using a function, the model element further programmatically defined by the at least one physical behavior, the at least one structural variable varying during model operation; and storing model operation results in a storage.

2. The method of claim 1, wherein the modeling environment comprises a textual and/or graphical modeling language defining to computationally based modeling environment.

3. The method of claim 1, wherein the physical entity comprises a structure, mechanism, or device having physical attributes that can be modeled.

4. The method of claim 1, wherein connections to the model element describing the physical component are non-directional.

5. The method of claim 1, wherein connections to the model element describing the physical component are acausal.

6. The method of claim 1, wherein user input varies the at least one structural variable prior to, during, or after model operation.

7. The method of claim 1, wherein the physical entity is comprised of at least one physical component.

8. The method of claim 1, further comprising expanding the model with hierarchical constructs of the model element.

9. In a computationally based modeling environment, a method of modeling a physical entity, the method comprising:
- selecting a physical component of the physical entity being modeled, the physical component programmatically defined by at least a structural physical parameter and at least one physical behavior;
- forming a model element modeling the physical component in the modeling environment by providing at least one function-based structural variable to programmatically define the structural physical parameter and at least one behavior to define the behavior of the model element; and
- operating the model element, the at least one structural variable varying during model operation.

10. The method of claim 9, wherein the modeling environment comprises a textual and/or graphical modeling language defining the computationally based modeling environment.

11. The method of claim 9, wherein the physical entity comprises a structure, mechanism, or device having physical attributes that can be modeled.

12. The method of claim 9, wherein connections to the model element modeling the physical component are non-directional.

13. The method of claim 9, wherein connections to the model element modeling the physical component are acausal.

14. The method of claim 9, wherein user input varies the at least one structural variable prior to, during, or after model operation.

15. The method of claim 9, wherein the physical entity is comprised of at least one physical component.

16. The method of claim 9, further comprising expanding the model with hierarchical constructs of model element.

17. In a computing device, a system providing a computationally based modeling environment modeling a physical entity having a physical component, the system comprising:
- a model for modeling the physical entity;
- a model element in the model that models the physical component of the physical entity by programmatically defining at least one physical behavior and at least a structural physical parameter programmatically defined using at least one structural variable, the at least one structural variable varying during model operation; and
- a storage for storing model operation results.

18. The system of claim 17, wherein the modeling environment comprises a textual and/or graphical modeling language defining the computationally based modeling environment.

19. The system of claim 17, wherein the physical entity comprises a structure, mechanism, or device having physical attributes that can be modeled.

20. The system of claim 17, wherein connections to the model element describing the physical component are non-directional.

21. The system of claim 17, wherein connections to the model element describing the physical component are acausal.

22. The system of claim 17, wherein user input varies the at least one structural variable prior to, during, or after model operation.

23. The system of claim 17, wherein the physical entity is comprised of at least one physical component.

24. The system of claim 17, wherein the model further comprises hierarchical constructs of the model element.

25. A medium for use in a computationally based modeling environment on a computing device, the medium holding instructions executable using the computing device for performing a method of modeling a physical entity, the method comprising:
- selecting a physical component of the physical entity being modeled, the physical component programmatically defined by at least a structural physical parameter and at least one physical behavior;
- programmatically defining a model element with the structural physical parameter using at least one structural variable defined using a function, the model element further programmatically defined by the at least one physical behavior; and
- operating the model element, the at least one structural variable varying during model operation.

26. The medium of claim 25, wherein the modeling environment comprises a textual and/or graphical modeling language defining the computationally based modeling environment.

27. The medium of claim 25, wherein the physical entity comprises a structure, mechanism, or device having physical attributes that can be modeled.

28. The medium of claim 25, wherein connections to the model element describing the physical component are non-directional.

29. The medium of claim 25, wherein connections to the model element describing the physical component are acausal.

30. The medium of claim 25, wherein user input varies the at least one structural variable prior to, during, or after model operation.

31. The medium of claim 25, wherein the physical entity is comprised of at least one physical component.

32. The medium of claim 25, wherein the model further comprises hierarchical constructs of the model element.

* * * * *

UNITED STATES PATENT AND TRADEMARK OFFICE
CERTIFICATE OF CORRECTION

| | |
|---|---|
| PATENT NO. | : 7,398,192 B2 |
| APPLICATION NO. | : 11/300973 |
| DATED | : July 8, 2008 |
| INVENTOR(S) | : Nathan E. Brewton |

It is certified that error appears in the above-identified patent and that said Letters Patent is hereby corrected as shown below:

On the Title page, in the abstract (57), line 10 please change "behaviors, that" to --behaviors that--.

In the specification, at column 6, line 59, please change "segement" to --segment--.

In the claims (claim 2) at column 12, line 67, please change "to" to --the--.

Signed and Sealed this

Twenty-first Day of October, 2008

JON W. DUDAS
*Director of the United States Patent and Trademark Office*